US006559521B2

(12) United States Patent
Tuttle

(10) Patent No.: US 6,559,521 B2
(45) Date of Patent: May 6, 2003

(54) CHIP CARRIER WITH MAGNETIC SHIELDING

(75) Inventor: Mark Tuttle, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/115,960

(22) Filed: Apr. 5, 2002

(65) Prior Publication Data

US 2002/0105058 A1 Aug. 8, 2002

Related U.S. Application Data

(62) Division of application No. 09/653,541, filed on Aug. 31, 2000.

(51) Int. Cl.[7] ............................................. H01L 23/552
(52) U.S. Cl. ....................... 257/659; 257/778; 257/422
(58) Field of Search ................................. 257/659, 778

(56) References Cited

U.S. PATENT DOCUMENTS

| 4,656,499 A | | 4/1987 | Butt ............................ 257/677 |
| 5,288,238 A | | 2/1994 | Ikenaka et al. ................ 439/91 |
| 5,352,925 A | * | 10/1994 | Sudoh et al. ................ 257/659 |
| 5,371,404 A | * | 12/1994 | Juskey et al. ................ 257/659 |
| 5,490,786 A | | 2/1996 | Mosquera et al. ............ 439/79 |
| 5,939,772 A | | 8/1999 | Hurst et al. ................. 257/659 |

* cited by examiner

*Primary Examiner*—David Nelms
*Assistant Examiner*—Tu-Tu Ho
(74) *Attorney, Agent, or Firm*—Dickstein Shapiro Morin & Oshinsky LLP

(57) ABSTRACT

A method and apparatus which provide one or more electromagnetic shield layers for integrated circuit chips containing electromagnetic circuit elements are disclosed. The shield layers may be in contact with the integrated circuit chip, including magnetic memory structures such as MRAMs, or in a flip-chip carrier, or both. A printed circuit board which supports the chip may also have one or more shield layers.

12 Claims, 3 Drawing Sheets

CHIP CARRIER WITH MAGNETIC SHIELDING

This application is a divisional of application Ser. No. 09/653,541, filed Aug. 31, 2000, which is incorporated herein by reference.

FIELD OF THE INVENTION

The present invention relates to a method and apparatus for shielding electromagnetic integrated circuits from external magnetic fields.

BACKGROUND OF THE INVENTION

In conventional packaging techniques, an integrated circuit chip or die is first attached to a carrier and then contacts of both the die and the carrier are electrically connected. One such packaged device, called a flip-chip device, requires a semiconductor chip to be flipped and bonded with a carrier, so that contacts of the chip directly bond to contacts of the carrier. Thus, both die bonding and interconnection are simultaneously accomplished.

A conventional bond flip-chip device 10 including an integrated circuit chip or die 30 and a flip-chip carrier 20 is illustrated in FIG. 1. The flip-chip carrier 20 is fabricated from a substrate 12, an insulating layer 14, a plurality of conductive traces 15 (FIG. 2) and an elastomeric layer 16. The conductive traces 15 may be located within or on the insulating layer 14 in a variety of ways, for example, by building up the conductive traces 15 on the insulating layer 14 through electrolytic deposition.

The conductive traces 15 (FIG. 2) are each electrically connected to a solder ball 28 through an inset (not shown) in the substrate 12. Although a single solder ball 28 is shown in FIG. 1, it must be understood that any number of solder balls 28 may be employed, as the solder balls 28 are used to mount the flip-chip device 10 to a circuit board or other electrical structure.

The die 30 is shown in dotted line above the flip-chip carrier 20. In use, the die 30 is positioned on the elastomeric material 16 of the flip-chip carrier 20. The flip-chip carrier 20 is electrically connected with the die 30 by way of suitable conductive connecting structures, such as, for example, solder balls 24 positioned within a gap 21 of the flip-chip carrier 20. The solder balls 24 are in electrical connection with respective conductive traces 15 and with suitable contacts on the die 30.

Recently, very-high density magnetic memories, such as magnetic random access memories (MRAMs), have been proposed to be integrated with CMOS circuits. This integration has also complicated the packaging of such devices, as the packaging must have a longer lifetime, better electrical performance, as well as more efficient heat dissipation.

A typical multilayer-film MRAM includes a plurality of bit or digit lines intersected by a plurality of word lines. At each intersection, layers of ferromagnetic film separated by a non-magnetic film are interposed between the corresponding bit line and word line to form a memory cell. When in use, an MRAM cell stores information as digital bits, the logic value of which depends on the states of magnetization of the thin magnetic multilayer films forming each memory cell. As such, the MRAM cell has two stable magnetic configurations, high resistance representing, for example, a logic state 0 and low resistance representing, for example, a logic state 1. The magnetization configurations of the MRAMs depend in turn on the magnetization vectors which are oriented as a result of electromagnetic fields applied to the memory cells. The electromagnetic fields used to read and write data are generated by associated CMOS circuitry. However, stray magnetic fields, which are generated external to the MRAM, may cause errors in memory cell operation when they have sufficient magnitude.

Very high-density MRAMs are particularly sensitive to stray magnetic fields mainly because the minuscule MRAM cells require relatively low magnetic fields for read/write operations which, in turn, depend upon the switching or sensing of the magnetic vectors. These magnetic vectors are, in turn, easily affected and have the magnetic orientation changed by such external stray magnetic fields.

To diminish the negative effects of the stray magnetic fields and to avoid sensitivity of MRAM devices to stray magnetic fields, the semiconductor industry could produce memory cells requiring higher switching electromagnetic fields than a stray field which the memory cells would typically encounter. However, the current requirements for operating such memory cells is greatly increased because higher internal fields necessitate more current. Thus, the reliability and scalability of such high current devices decrease accordingly, and the use of MRAMs which may be affected by stray magnetic fields becomes undesirable.

Accordingly, there is a need for an improved magnetic memory packaging structure and a method of forming it, which shield against external magnetic fields and which permit use of lower power levels for circuit operations. There is also a need for a flip-chip packaging device for mounting a magnetic random access memory IC chip which reduces the effects of external magnetic fields on internal memory cell structures and operations. There is further a need for minimizing the cost of a packaging which shields a magnetic random access memory IC chip from external magnetic fields.

SUMMARY OF THE INVENTION

The present invention provides a method for fabricating magnetically shielded electromagnetic integrated circuit structures, such as MRAM structures. The present invention employs one or more magnetic shields which are incorporated either on an integrated circuit chip which contains electromagnetic structures, or in a flip-chip packaging device, or in both. In one exemplary embodiment of the invention, the electromagnetic shield is formed as one or more layers of magnetic field shielding material incorporated on the integrated circuit chip or in a flip-chip carrier, or both. In another exemplary embodiment, a printed circuit board supporting the flip-chip packaging may also include shielding material.

These and other features and advantages of the invention will be more clearly apparent from the following detailed description which is provided in connection with accompanying drawings and which illustrates exemplary embodiments of the invention.

DETAILED DESCRIPTION OF THE PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

Figure 1:
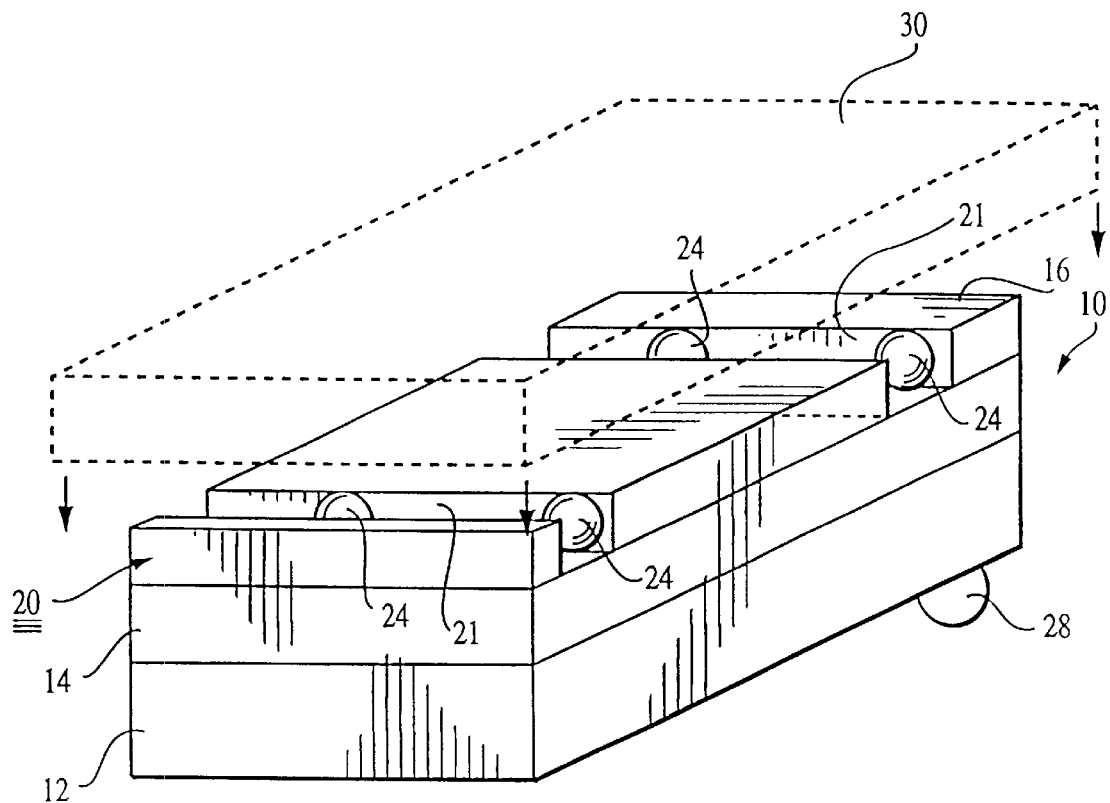
FIG. 1 is a perspective view of a conventional flip-chip device.
Figure 2:
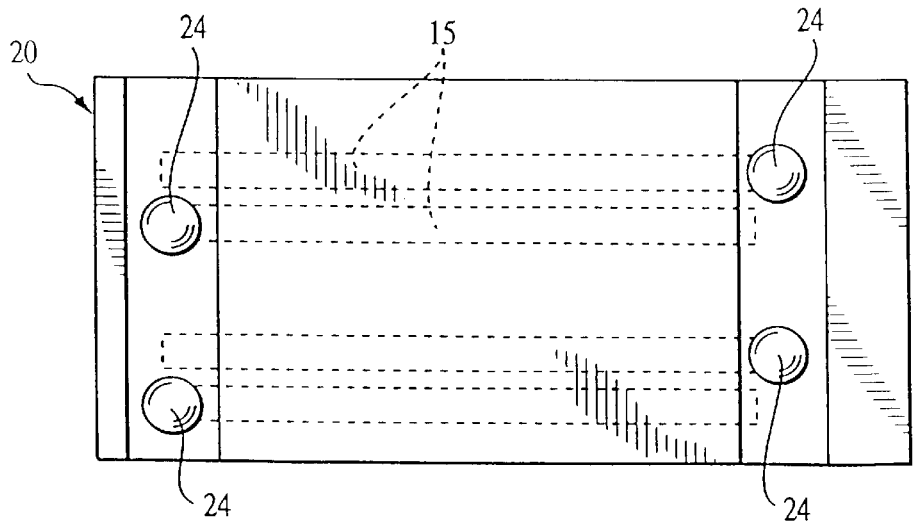
FIG. 2 is a top view of the conventional flip-chip device of FIG. 1.
Figure 3:
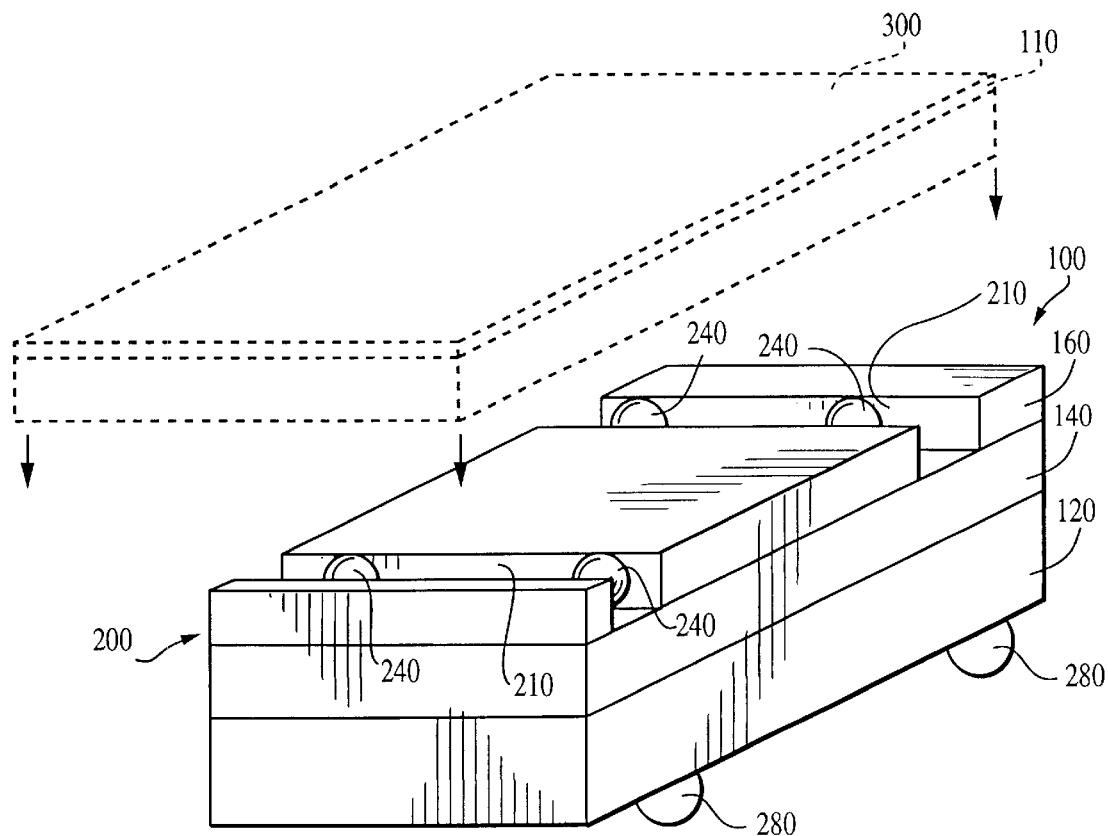
FIG. 3 is a perspective view of an integrated circuit package assembly in accordance with a first exemplary embodiment of the present invention.

Referring now to the drawings, where like elements are designated by like reference numerals, FIGS. 3–6 illustrate exemplary embodiments of the present invention. FIG. 3 depicts an integrated circuit (IC) package assembly 100 at an intermediate stage of processing. A semiconductor chip or die 300 includes an array of internal electromagnetic structures, such as MRAM cells and access circuitry, and is shown in dotted line above a flip-chip carrier 200.

The flip-chip carrier 200 is fabricated from a substrate 120, an insulating layer 140, a plurality of conductive traces (not shown) and an elastomeric layer 160. The substrate 120 is typically formed of a material with high mechanical stability at high temperature. The substrate 120 may be a flexible tape such as, for example, a polyimide tape. Two commercially available polyimide tapes, KAPTON® from E. I. DuPont Nemours and Company and UPILEX® from Ube Industries, Ltd., can be employed to form the substrate 120. The elastomeric layer 160 may be formed of a silicone or a silicone-modified epoxy.

The conductive traces may be located within or on the insulating layer 140 in a variety of ways. One way, which is an addition method, is to build up the conductive traces on the insulating layer 140 through electrolytic deposition. The electrolytic deposition may be accomplished with a mask or, if performed without a mask, a subsequent etching step may be employed to create the conductive traces. Other suitable methods include sputter coating and laminating a sheet of conductive material, such as copper, and etching away excess copper to form the traces.

The conductive traces are each electrically connected to solder balls 280 through an inset (not shown) in the substrate 120. The solder balls 280 are used to mount the flip-chip device carrier 200 with the chip 300 to a circuit board or other electrical structure, as it will be described in more detail below.

Figure 4:
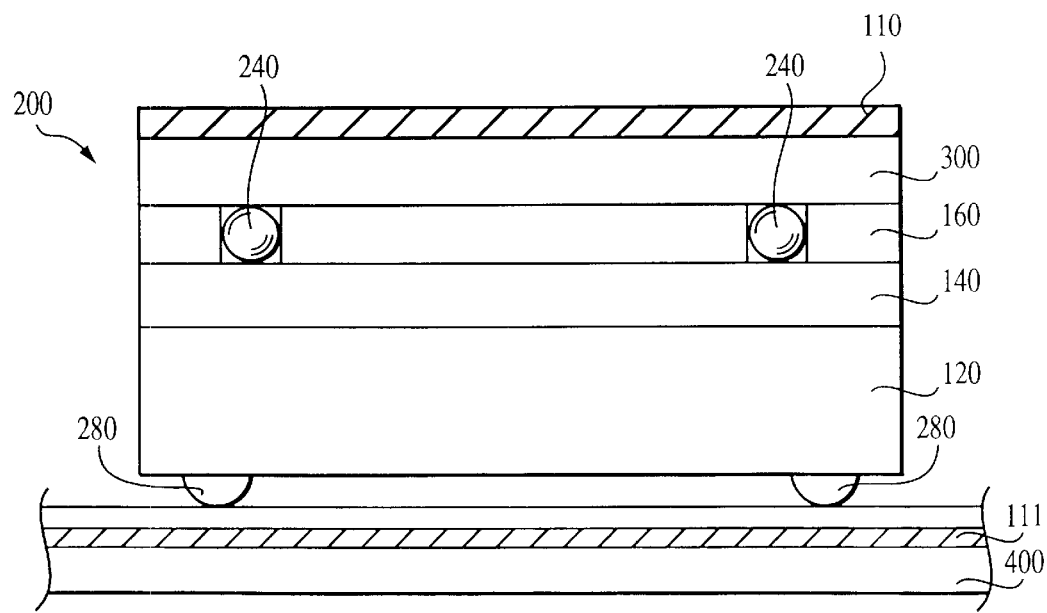
FIG. 4 is a side view of the package assembly of FIG. 3.

As shown in FIG. 3, the chip 300, including magnetic memory structures such as MRAM cells, is shown in dotted line above the flip-chip carrier 200. In use, the chip 300 is positioned on the elastomeric material 160 of the flip-chip carrier 200, as illustrated in FIG. 4. As known in the art, the flip-chip carrier 200 is electrically connected with the chip 300 by way of suitable conductive connecting structures, such as, for example, solder balls 240 positioned within a gap 210 of the carrier 200. The solder balls 240 are in electrical connection with respective conductive traces 150 (not shown) and with suitable contacts on the chip 300.

Referring now to FIGS. 3–4, a first magnetic shielding layer 110 is provided for shielding the chip 300 from external magnetic field disturbances. According to a first exemplary embodiment of the present invention, the first magnetic shielding layer 110 is formed on the back surface of the semiconductor chip 300, that is the surface that is opposite to a front surface of the semiconductor chip 300 or the surface that directly contacts the flip-chip carrier 200.

The first magnetic shielding layer 110 comprises a magnetic shielding material which can be formed, for example, of an electrically non-conductive material with permeability higher than that of air or silicon. As such, the preferred choice for the magnetic shielding material is a non-conductive magnetic oxide, for example, a ferrite such as $MFe_2O_4$, wherein M=Mn, Fe, Co, Ni, Cu, or Mg, among others. Manganites, chromites and cobaltites may be used also, depending on the device characteristics and specific processing requirements. Further, the magnetic shielding material may be also composed of conductive magnetic particles, for example nickel, iron or cobalt particles, which are incorporated into a non-conductive base material, such as a glass sealing alloy or a polyimide. Alternatively, the magnetic shielding material may be formed of a film or layer of conductive magnetic material, such as nickel, cobalt, iron, Permalloy, or Mumetal, among others.

Next, as illustrated in FIG. 4, the flip-chip carrier 200 with the attached chip 300 is further attached to a portion of a printed circuit board 400 by surface mounting, for example. This way, the flip-chip carrier 200 is mounted flat on the printed circuit board 400 and contacts the printed circuit board 400 through the solder balls 280, eliminating the need for holes through the printed circuit board.

As shown in FIG. 4, a flat layer 111 of magnetic shielding material may be embedded within the printed circuit board, which can be otherwise formed of a resin compound, for example, or other known printed circuit board material. In this case, the magnetic memory structures of the chip 300 are first shielded by the first magnetic shielding layer 110 and further shielded by the flat layer 111 of the printed circuit board 400 for maximum protection from external stray magnetic fields.

Figure 5:
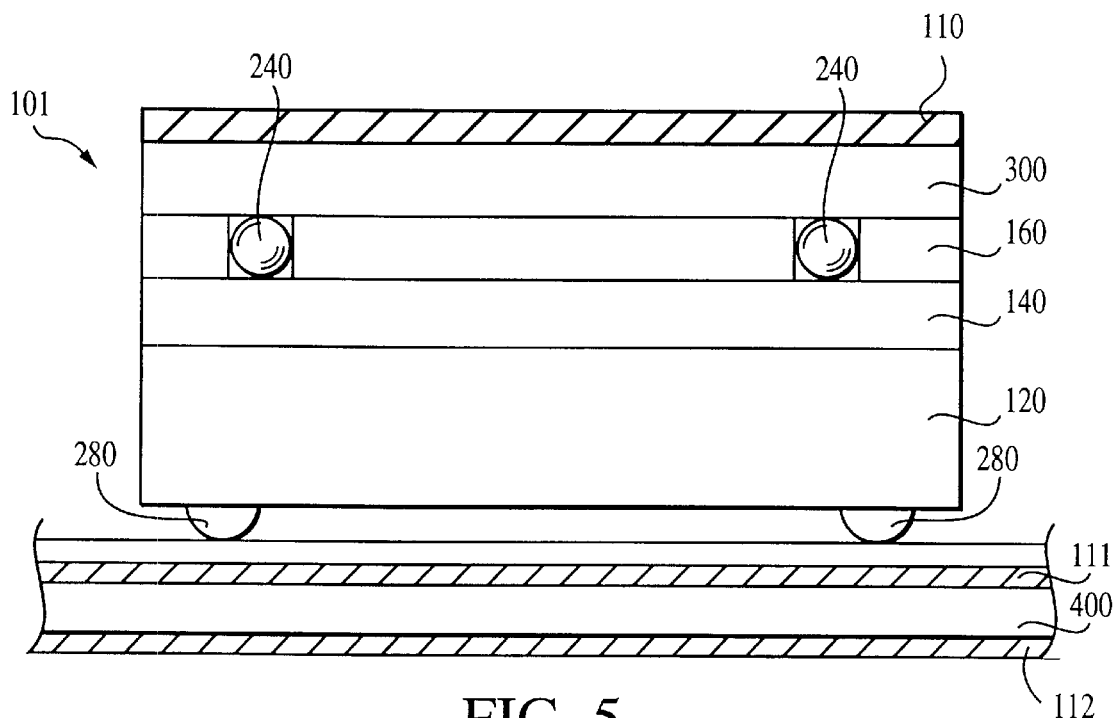
FIG. 5 is a side view of the package assembly of FIG. 3 and in accordance with a second exemplary embodiment of the present invention.

Although FIG. 4 shows the magnetic shielding material in the form of layer 110 on the backside of chip 300 and as layer 111 embedded within the printed circuit board 400, it is also possible to apply a layer of shielding material on the bottom surface of the printed circuit board 400 instead. For example, FIG. 5 illustrates another exemplary embodiment of the present invention, in which a bottom magnetic shielding layer 112 is formed on the bottom surface of the printed circuit board 400, together with the flat layer 111 embedded within the printed circuit board 400.

The preferred material for the bottom magnetic shielding layer 112 is a conductive Mumetal alloy comprising, for example, approximately 77% nickel (Ni), 4.8% copper (Cu), 1.5% chromium (Cr) and 14.9% iron (Fe), as well as conductive magnetic particles, such as nickel or iron particles, incorporated into a molding material, for example a glass sealing alloy or a commercially available mold compound. However, non-conductive magnetic oxide, for example a ferrite such as $MFe_2O_4$, wherein M=Mn, Fe, Co, Ni, Cu, or Mg, among others, may be used also, as well as manganites, chromites and cobaltites, depending on the device characteristics and processing requirements.

Figure 6:
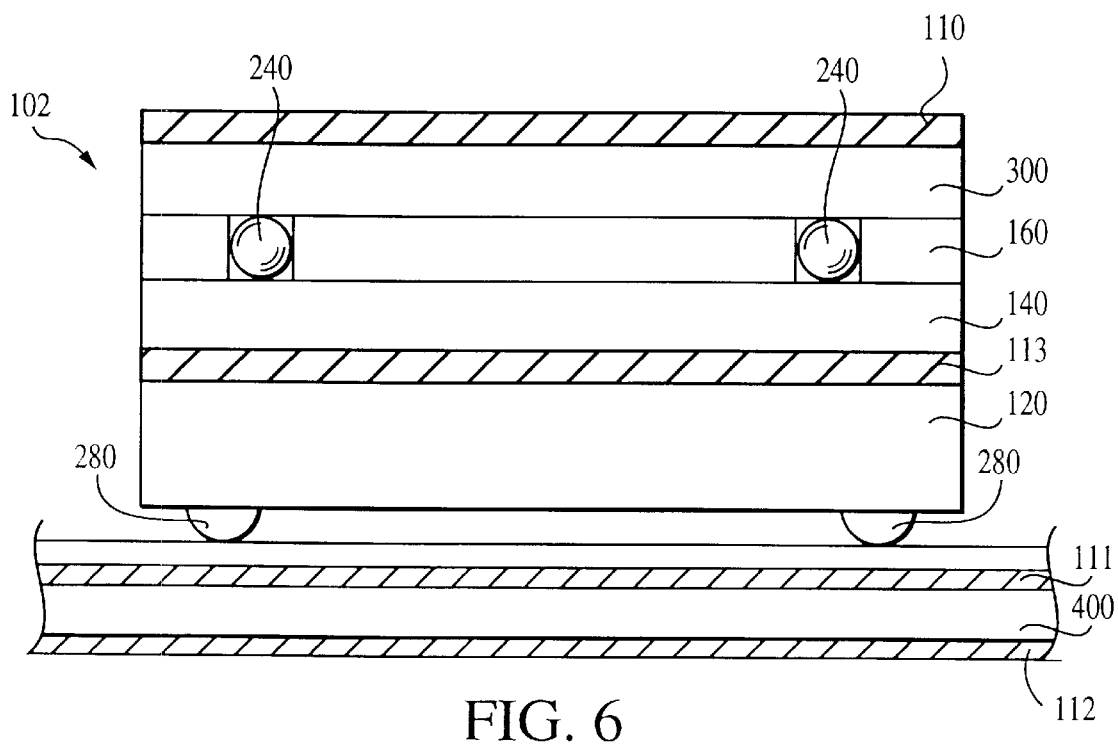
FIG. 6 is a side view of the package assembly of FIG. 3 and in accordance with a third exemplary embodiment of the present invention.

In yet a third embodiment of the present invention, another magnetic shielding layer 113 is formed of a magnetic shielding material as part of the flip-chip carrier 200, as shown in FIG. 6. The magnetic shielding layer 113 is formed between the substrate 120 and the insulating layer 140 to further protect the MRAM devices from external magnetic fields and to complete the fabrication of an IC package assembly 102 (FIG. 6). The magnetic shielding material may be different than, or similar to, the magnetic shielding materials for layers 110, 111 and 112. Appropriate conductive vias, insulated from magnetic shielding layer 113, are formed through layer 113. Again, the magnetic shielding material may be preferably a non-conductive magnetic oxide, for example a ferrite such as $MFe_2O_4$, wherein M=Mn, Fe, Co, Ni, Cu, or Mg, among others, or a manganite, chromite or cobaltite. Further, the magnetic shielding material may be also composed of magnetic particles, for example nickel, iron or cobalt particles, which are incorporated into a base material such as a glass sealing alloy or a commercially available mold compound. Since nickel is conductive, however, the concentration of nickel particles in the glass alloy should be low enough so that the shielding material does not form a continuous conductor, unless appropriate conductive vias electrically insulated from the magnetic layer are used.

Although the exemplary embodiments described above refer to specific magnetic shielding materials, it must be understood that the invention is not limited to the materials described above, and other magnetic shielding materials, such as ferromagnetics like nickel-iron (Permalloy), cobalt-nickel-iron, nickel or iron may be used also.

In addition, the magnetic shielding material forming the various shielding layers described above may also comprise a mold compound, such as a plastic compound, with conductive magnetic particles therein. For example, conductive magnetic particles of, for example, nickel, iron, and/or cobalt, may be suspended in a matrix material, such as a plastic compound, at a concentration that does not allow the particles to touch each others. Alternatively, the magnetic shielding material may comprise a molding material including non-conductive particles of, for example, non-conductive magnetic oxides and/or Mumetal alloys. Mumetal alloys may comprise, for example, approximately 77% nickel (Ni), 4.8% copper (Cu), 1.5% chromium (Cr) and 14.9% iron (Fe).

Further, although the exemplary embodiments described above refer to specific locations where the shielding material is applied to a chip, it is also possible to apply the shielding material in other locations. For example, it is also possible to apply a layer of shielding material on both the top and bottom surfaces of the printed circuit board 400, or on the top and bottom surfaces together with a shielding material embedded within the printed circuit board. Further, a plurality of layers of material could be employed for shielding the magnetic memories structures, one on each side of chip 300, or layers of the same or different shielding materials which overlap each other may be used on one or both sides of chip 300, flip-chip carrier 200 and/or circuit printed board 400. In addition, the specific shape of the shielding material is not limited to that shown in FIGS. 3–6 and other shapes, configurations, or geometries may be employed. Also, the chip 300 and associated flip-chip carrier 100 may be encapsulated in a flip-chip package which is mountable through solder balls 180 to a printed circuit board.

The present invention is thus not limited to the details of the illustrated embodiments and the above description and drawings are only to be considered illustrative of exemplary embodiments which achieve the features and advantages of the present invention. Modifications and substitutions to specific process conditions and structures can be made without departing from the spirit and scope of the present invention. Accordingly, the invention is not to be considered as being limited by the foregoing description and drawings, but is only limited by the scope of the appended claims.

What is claimed as new and desired to be protected by Letters Patent of the United States is:

1. A chip carrier for supporting an integrated circuit chip containing structures which may be affected by external magnetic fields, said chip carrier comprising:

a substrate having a top surface and a bottom surface supporting first conductive elements;

an insulating layer over said top surface of said substrate, said insulating layer including a plurality of conductive traces which are connected to said first conductive elements;

a chip support surface over said insulating layer;

second conductive elements for connection between contacts of a chip supported on said support surface and said conductive traces; and a layer of magnetic field shielding material.

2. The chip carrier of claim 1, wherein said magnetic field shielding material comprises a magnetic material selected from the group consisting of ferrites, manganites, chromites and cobaltites.

3. The chip carrier of claim 2, wherein said magnetic material comprises $MFe_2O_4$, wherein M is at least one atom selected from the group consisting of Mn, Fe, Co, Ni, Cu, and Mg.

4. The chip carrier of claim 2, wherein said magnetic material comprises a material which includes conductive particles.

5. The chip carrier of claim 4, wherein said magnetic material comprises a material which includes nickel particles.

6. The chip carrier of claim 4, wherein said magnetic material comprises a material which includes iron particles.

7. The chip carrier of claim 4, wherein said magnetic material comprises a material which includes cobalt particles.

8. The chip carrier of claim 1, wherein said layer of magnetic field shielding material is located in between said top surface of said substrate and said insulating layer.

9. The chip carrier of claim 1, wherein said layer of magnetic field shielding material is located on said bottom surface of said substrate.

10. The chip carrier of claim 1, wherein said layer of magnetic field shielding material is located over said top surface of said insulating layer.

11. The chip carrier of claim 1, wherein said integrated circuit chip contains a magnetic memory structure.

12. The chip carrier of claim 11, wherein said magnetic memory structure is a magnetic random access memory device.

* * * * *